(12) United States Patent
Dokumaci et al.

(10) Patent No.: US 6,514,843 B2
(45) Date of Patent: Feb. 4, 2003

(54) METHOD OF ENHANCED OXIDATION OF MOS TRANSISTOR GATE CORNERS

(75) Inventors: Omer Dokumaci, Wappingers Falls, NY (US); Oleg Gluschenkov, Wappingers Falls, NY (US); Suryanarayan G. Hegde, Hollowville, NY (US); Richard Kaplan, Wappingers Falls, NY (US); Mukesh Khare, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/844,977

(22) Filed: Apr. 27, 2001

(65) Prior Publication Data

US 2002/0160593 A1 Oct. 31, 2002

(51) Int. Cl.[7] ........................................... H01L 21/4763
(52) U.S. Cl. ...................... 438/595; 438/585; 438/514; 438/766; 438/770
(58) Field of Search ................................. 438/585, 595, 438/635, 519, 517, 522, 765, 766, 768, 769, 770

(56) References Cited

U.S. PATENT DOCUMENTS

| | | | | |
|---|---|---|---|---|
| 5,707,888 A | * | 1/1998 | Aronowitz et al. | 438/440 |
| 5,869,385 A | * | 2/1999 | Tang et al. | 438/440 |
| 5,920,782 A | * | 7/1999 | Shih et al. | 438/303 |
| 6,229,184 B1 | * | 5/2001 | Riccobene | 257/368 |
| 6,329,704 B1 | * | 12/2001 | Akatsu et al. | 257/655 |
| 6,355,580 B1 | * | 3/2002 | Li et al. | 438/788 |

* cited by examiner

Primary Examiner—Carl Whitehead, Jr.
Assistant Examiner—Maria Guerrero
(74) Attorney, Agent, or Firm—Scully, Scott, Murphy & Presser; Marian Underweiser, Esq.

(57) ABSTRACT

A method of enhancing the rate of transistor gate corner oxidation, without significantly increasing the thermal budget of the overall processing scheme is provided. Specifically, the method of the present invention includes implanting ions into gate corners of a Si-containing transistor, and exposing the transistor including implanted transistor gate corners to an oxidizing ambient. The ions employed in the implant step include Si; non-retarding oxidation ions such as O, Ge, As, B, P, In, Sb, Ga, F, Cl, He, Ar, Kr, and Xe; and mixtures thereof.

22 Claims, 2 Drawing Sheets

METHOD OF ENHANCED OXIDATION OF MOS TRANSISTOR GATE CORNERS

FIELD OF THE INVENTION

The present invention relates to semiconductor device fabrication, and more particularly to a method for fabricating metal oxide semiconductor (MOS) transistors wherein the rate of corner oxidation is enhanced without significantly increasing the thermal budget of the overall processing scheme.

BACKGROUND OF THE INVENTION

Modem Si-based metal-insulator-semiconductor (MIS) field effect transistors (FETs) are fabricated with the use of so-called sidewall or corner oxidation of the gate corner. Sidewall oxidation processes are routinely employed in conventional process flows such as complementary metal oxide semiconductor (CMOS) logic, static random access memory (SRAM), dynamic random access memory (DRAM), embedded DRAM, flash memories and other like processing flows.

As is known to those skilled in the art, sidewall oxidation of the gate corners thickens the gate insulator at the gate corner. Thick corner insulators prevent electrical breakdown at the device corners. The corner insulator also reduces the electric field by effectively rounding the corner during oxidation. A higher corner electric field can produce large hot-carrier effects leading to poor transistor reliability. In addition, the planar oxide grown during corner oxidation is used as a screen oxide for a subsequent ion-implantation step, thus, simplifying process integration flow. All these benefits of sidewall (or corner) oxidation are well known in the art; therefore a detailed discussion concerning the same is not needed herein.

In prior art processes, oxidation of the gate corners is generally carried out relatively late in the process flow. For example, oxidation of the gate corners typically occurs after well and channel implantations have been performed with the gate stack already present on the substrate. Thermal budget of the corner oxidation is therefore a very important parameter that must be taken into account when fabricating transistor devices. High thermal budget at a late stage of the process flow can cause undesirable dopant diffusion; and reaction and intermixing of the gate stack, gate insulator and channel materials. It is, therefore, very desirable to reduce thermal budget of the corner oxidation without degrading corner oxide quality and reliability.

Corner oxidation is usually carried out in an oxidizing ambient such as $O_2$, $H_2O$ or oxygen radicals. Wet ($H_2O$) or free radical assisted oxidation processes are preferred due to their fast rates and thus low thermal budgets. However, introduction of new materials into the gate stack may hinder such a trend. Metal gates and high dielectric constant, k, gate insulators may not be compatible with fast rate oxidation processes. For example, water molecules and oxygen radicals can oxidize a gate metal during gate corner oxidation. A specific oxidizing ambient is needed to selectively oxidize Si, but not the metal. It is well known in the art that such mixtures for selective corner oxidation are low-rate oxidation ambients. Due to various compatibility requirements on the corner oxidation ambient, it is highly desirable to reduce thermal budget of the corner oxidation independently of the oxidation ambient.

In view of the above-mentioned drawbacks with prior art corner oxidation processes, there is a continued need for developing a new and improved corner oxidation method that enhances the rate of corner oxidation without significantly increasing the thermal budget of the overall process flow.

SUMMARY OF THE INVENTION

One object of the present invention is to provide a method for enhancing the oxidation of transistor gate corners.

A further object of the present invention is to provide a method for enhancing gate corner oxidation which does not significantly increase the thermal budget of the overall processing flow.

A yet further object of the present invention is to provide a method for enhancing gate corner oxidation that is independent of the oxidation ambient employed.

An even further object of the present invention is to provide a method for enhancing gate corner oxidation using processing steps that are compatible with a variety of gate stack structures including various implementation of metal gates and high-k gate insulators. Note that the term "high-k" is used herein to denote a dielectric material that has a dielectric constant (measured in terms of a vacuum) that is greater than $SiO_2$.

These and other objects and advantages are achieved by implanting non-oxidation retarding or Si ions into the transistor gate corners and thereafter exposing the implanted gate corners to an oxidizing ambient. The transistors employed in the present invention include, but are not limited to: MIS, MOSFET and other like transistors which include gate corners.

Specifically, the method of the present invention comprises the steps of:

(a) implanting ions into gate corners of a Si-containing transistor, wherein said ions are selected from non-oxidation retarding ions, Si ions and mixtures thereof; and (b) exposing the Si-containing transistor including the implanted gate corners to an oxidizing ambient.

The phrase "non-oxidation retarding ions" is used herein to denote ions that do not lower the rate of oxidation of silicon. Illustrative examples of such non-retarding oxidation ions include, but are not limited: O, Ge, As, B, P, In, Sb, Ga, F, Cl, He, Ar, Kr, Xe and mixtures thereof including mixtures with Si ions.

As stated above, the transistor employed in the present invention is a Si-containing transistor. The phrase "Si-containing transistor" as used herein denotes a transistor wherein at least one of the following regions: substrate, gate dielectric, gate conductor or any combination thereof, comprises a Si-containing material.

DETAILED DESCRIPTION OF THE INVENTION

Figure 1A:
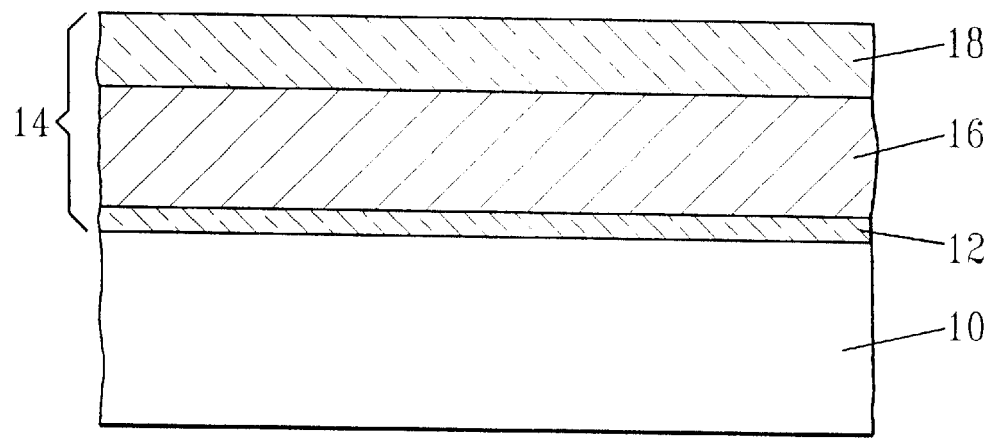
FIGS. 1A–1F are pictorial representations (through cross-sectional views) illustrating the processing steps employed in the present invention for fabricating a transistor having enhanced gate corner oxidation.

The present invention which provides a method of enhancing oxidation of transistor gate corners will now be described in more detail by referring to the drawings that accompany the present application. It is noted that in the drawings, like and/or corresponding elements are referred to by like reference numerals.

Reference is first made to FIG. 1A which illustrates an initial structure that can be employed in the present invention. Specifically, the initial structure shown in FIG. 1A comprises Si-containing substrate 10, gate dielectric 12, and gate stack 14.

The transistor structure shown in FIG. 1A includes conventional materials that are well known in the art and the structure is fabricated using conventional processing steps that are also well known in the art. For example, Si-containing substrate 10 comprises any Si-containing semiconducting material including, but not limited to: Si, SiGe, SiGeC, SiC and other like Si-containing semiconductors. Layered semiconductors such as Si/Si, Si/SiGe and silicon-on-insulators (SOIs) may also be employed in the present invention as Si-containing substrate 10. Si-containing substrate 10 may be undoped, or alternatively the substrate may be doped with an n-or p-type dopant ion.

The substrate may contain various isolation regions such as shallow trench isolation (STI) or local oxidation of silicon (LOCOS) isolation regions formed in the surface thereof. Additionally, the substrate may include well regions, buried diffusion regions and other like regions. For clarity, the drawings of the present invention do not specifically show the presence of any of the above-mentioned regions; however, reference numeral 10 is meant to include those regions. One highly preferred Si-containing substrate employed in the present invention is a substrate that is comprised of Si.

Gate dielectric (or gate insulator) 12 is then formed on a surface of substrate 10 utilizing a conventional deposition process such as chemical vapor deposition (CVD), plasma-assisted CVD, evaporation, sputtering, atomic layer chemical vapor deposition (ALCVD), molecular beam epitaxy (MBE) and chemical solution deposition. Alternatively, the gate dielectric may be formed by a thermal oxidation, nitridation or oxynitridation process.

Gate dielectric 12 is comprised of a dielectric material including, but not limited to: oxides, nitrides, oxynitrides and mixtures or multilayers thereof. A highly preferred dielectric material that is employed in the present invention as gate dielectric 12 is $SiO_2$. Note that the dielectrics employed in the present invention may have a higher or lower dielectric constant, k, than $SiO_2$.

The physical thickness of gate dielectric 12 may vary, but typically the gate dielectric has a thickness of from about 0.4 to about 20 nm, with a thickness of from about 0.5 to about 10 nm being more highly preferred.

After forming the gate dielectric on a surface of the substrate, gate stack 14 is formed on the surface of gate dielectric 12. The gate stack employed in the present invention includes at least gate conductor 16. Optionally, the gate stack may also include dielectric cap 18.

Gate conductor 16 of gate stack 14 may be composed of any conventional conductive material including, but not limited to: elemental metals such as W, Pt, Pd, Ru, Rh, Ir, Co, Ni, Mo, Ti, Cr, Os or combinations and multilayers thereof; suicides and nitrides of the foregoing elemental metals; undoped or doped polysilicon, amorphous silicon and combinations or multilayers thereof. One highly preferred conductive material employed as gate conductor 16 of gate stack 14 is a multilayer comprised of doped polysilicon, Ti diffusion barrier layer and tungsten. Note that the diffusion barrier layer is optional in the present invention and it may include other well-known diffusion barriers such as Ta, TiN, TaN, and $W_2N$.

Gate conductor 16 is formed utilizing a conventional deposition process such as CVD, plasma-assisted CVD, sputtering, evaporation, chemical solution deposition and plating. When metal silicides are employed, a conventional silicidation process may be employed in forming the same. On the other hand, when doped polysilicon is employed as gate conductor 16, the doped polysilicon may be formed by an in-situ doping deposition process, or alternatively a layer of undoped polysilicon is first deposited and thereafter conventional ion implantation is employed in doping the layer of polysilicon.

The physical thickness of gate conductor 16 formed in the present invention may vary depending on the conductive material employed as well as the process used in forming the same. Typically, however, gate conductor 16 has a thickness of from about 10 to about 300 nm, with a thickness of from about 20 to about 200 nm being more highly preferred.

Optionally, dielectric cap 18 is then formed on gate conductor 16 providing the layered structure shown in FIG. 1A. In accordance with the present invention, dielectric cap 18 includes any conventional hardmask material such as an oxide, nitride, oxynitride and combinations or multilayers thereof which is applied using conventional processes well known in the art. For example, the dielectric cap may be applied by utilizing a conventional deposition process such as CVD, plasma-assisted CVD, evaporation, chemical solution deposition and other like deposition processes. Alternatively, a conventional thermal growing process may be employed in forming dielectric cap 18. It is again emphasized that the dielectric cap is optional and need not be employed in the present invention.

Figure 1B:
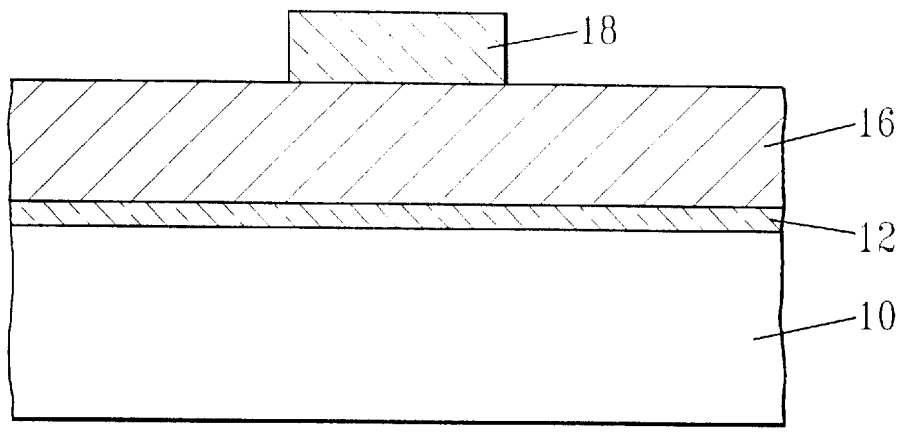

In applications when a dielectric cap is present on the gate conductor, as shown in the drawings, a layer of photoresist (not shown) is then formed on the dielectric cap and that structure is subjected to conventional lithography which includes exposing the layer of photoresist to a pattern of radiation, developing the pattern by utilizing an appropriate developer solution, and transferring the pattern to the underlying dielectric cap via a conventional dry etching process such as reactive-ion etching. The resultant patterned structure, after stripping of the photoresist, is shown, for example, in FIG. 1B. Patterned dielectric cap 18 is used in defining the channel length of the gate region of the resultant structure.

Note that when no dielectric cap is present on the gate conductor, a patterned resist is formed on the gate conductor by using conventional lithography and the patterned resist remains on the structure during patterning of the gate conductor.

It is noted that although the drawings depict the formation of one masked region on the gate conductor, the present invention works when more than one masked region is formed on the gate conductor. Thus, the present invention is capable of forming a plurality of gate regions on the surface of substrate 10.

Figure 1C:
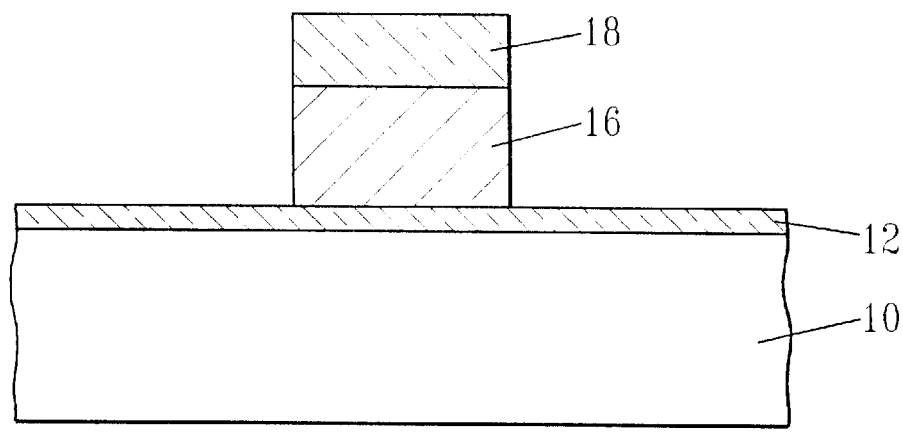

Following formation of the patterned dielectric cap and stripping of the photoresist, exposed portions of gate conductor 16 not protected by patterned dielectric cap 18 (or patterned resist) are removed stopping on gate dielectric 12 so as to provide the structure shown in FIG. 1C. In accordance with this step of the present invention, the exposed portions of gate conductor 16 are removed utilizing an anisotropic etching process that is highly selective in removing gate conductor material as compared to dielectric. One type of anisotropic etching process that can be employed in the present invention in forming the structure shown in FIG. 1C is a reactive-ion etching (RIE) process wherein a halogen-containing plasma is used as the etchant gas. It should be noted that during this etching step of the present invention some or all of gate dielectric 12 surrounding the patterned layers may be removed.

Note that the structure shown in FIG. 1C is a transistor structure having a gate region that is comprised of patterned dielectric cap 18 and patterned gate conductor 16. The transistor structure also includes gate dielectric 12 and substrate 10. Note that the transistor structure shown in FIG. 1C includes gate corner regions 20 that are located at the base of the patterned gate conductor. Note that when no dielectric cap is employed, the structure would look similar to the one depicted in FIG. 1C except that no patterned dielectric cap is present on the structure.

Figure 1D:
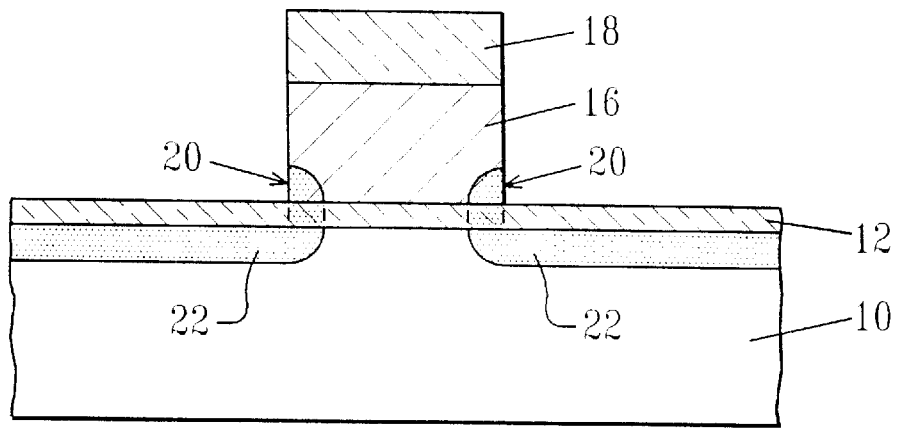

In accordance with the next step of the present invention, ions are implanted into transistor gate corners 20 so as to form implant regions 22 at the gate corners, See FIG. 1D. The ions employed in this step of the present invention, which are capable of enhancing the rate of sidewall oxidation, include, but are not limited to: non-oxidation retarding ions, Si ions and mixtures thereof. The phrase "non-oxidation retarding ions" is used herein to denote ions that do not lower the rate of oxidation of silicon. Illustrative examples of such non-retarding oxidation ions include, but are not limited: O, Ge, As, B, P, In, Sb, Ga, F, Cl, He, Ar, Kr, Xe and mixtures thereof including mixtures with Si ions.

This implant step of the present invention, which forms implant regions 22 at gate corner regions 20, is performed using an ion dose of from about 1E13 to about 1E17 cm$^{-2}$, with an ion dose of from about 1E14 to about 1E16 cm$^{-2}$ being more highly preferred. Moreover, this ion implantation step of the present invention is carried out at an energy of from about 1 eV to about 1 MeV, with an energy of from about 100 eV to about 100 keV being more highly performed. It is noted that by using the above conditions, no significant diffusion of dopants present in the transistor structure is observed. Implantation may occur using a straight ion implantation process or an angle ion implantation process may also be employed in the present invention.

Figure 1E:
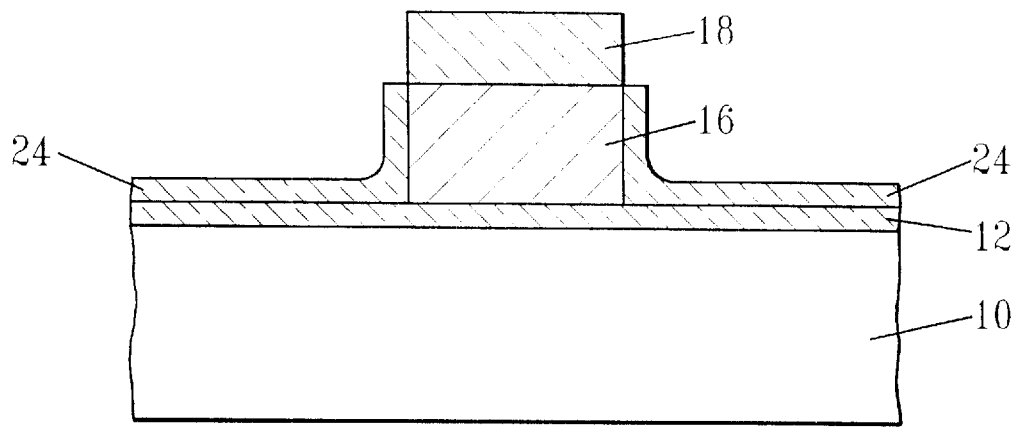

Following implantation of the above-mentioned ions into gate corner regions 20, the structure shown in FIG. 1D is then exposed to a conventional sidewall oxidation process that is capable of forming thermal oxide layer 24 on top of substrate 10 (or remaining gate dielectric 12) and/or on the exposed sidewalls of patterned gate conductor 16. The resultant structure containing thermal oxide layer 24 is shown, for example, in FIG. 1E.

The conditions used in forming thermal oxide layer 24 may vary depending upon the exact sidewall oxidation process performed. Typically, however, the sidewall oxidation employed in the present invention is carried out at a temperature of from about 600° to about 1200° C. for a time period of from about 0.1 seconds to about 2 hours. More preferably, the sidewall oxidation process employed in the present invention is carried out at a temperature of from about 800° to about 1100° C. for a time period of from about 1 second to about 1 hour. It is noted that the present invention contemplates the use of rapid thermal sidewall oxidation processes or furnace sidewall oxidation processes.

The sidewall oxidation may be carried out at a single targeted oxidation temperature or alternatively, the sidewall oxidation may be carried out using various ramp and soak cycles wherein the ramp rate for heating and cooling may be from about 0.1° C./min to about 1000° C./seconds.

Notwithstanding the conditions employed, the sidewall oxidation step of the present invention is carried out in an oxidizing ambient. The term "oxidizing ambient " as used herein denotes any oxygen-containing atmosphere including, but not limited to: $O_2$, steam, $N_2O$, NO, oxygen radicals and mixtures thereof. In some embodiments of the present invention, the oxidizing ambient may be diluted with $H_2$ so that the resultant oxidizing ambient selectively oxidizes the Si-containing substrate and the Si-containing gate conductor, but not the metal of the gate conductor. When a selective oxidizing ambient is employed, the selective ambient typically includes from about 0.1 to about 40% oxygen-containing atmosphere and from about 60 to about 99.9% of $H_2$.

The physical thickness of the resultant thermal oxide layer formed by the sidewall oxidation step of the present invention may vary depending on the exact conditions employed. Typically, however, thermal oxide layer 24 has a thickness of from about 1 to about 20 nm, with a thickness of from about 2 to about 10 nm being more highly preferred.

It is noted that because of the presence of the implanted ions and the damaged caused thereby at the gate corners, the rate of sidewall oxidation is significantly enhanced as compared to conventional processes wherein no implants are present at the gate corner regions. In some instances, an improvement in the rate of gate corner oxidation of about 50% or more is observed. Thus, the inventive method represents a significant improvement over prior art gate corner oxidation processes.

Figure 1F:
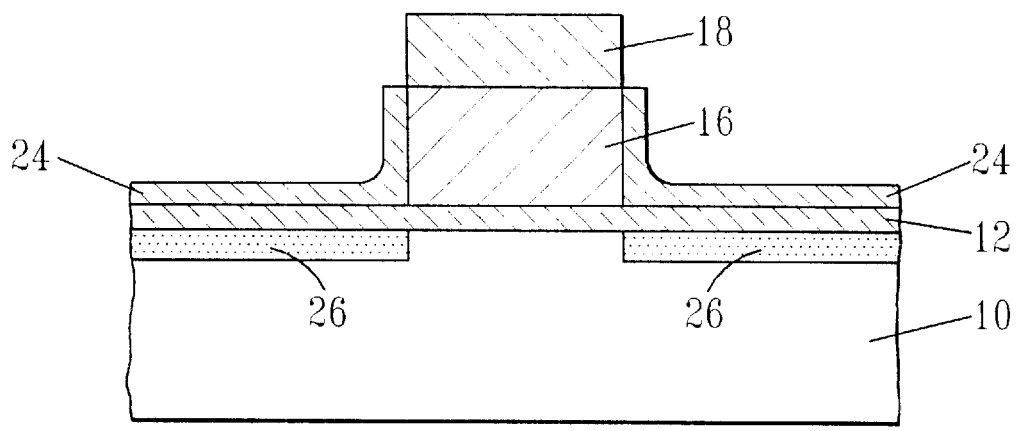

Following the gate sidewall oxidation process, conventional CMOS/DRAM processing steps that are well known to those skilled in the art may be performed. For example, ion implantation and activation annealing may be employed so as to form diffusion regions 26 (i.e., source/drain regions) beneath the patterned gate conductor as is shown in FIG. 1F.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention is not limited to the exact forms and details described and illustrated, but fall within the scope of the appended claims.

Having thus described our invention in detail, what we claim as new and desire to secure by the Letters Patent is:

1. A method or oxidizing transistor gate corners comprising the steps of:
   (a) implanting ions into gate corners of a Si-containing transistor to form implant regions at least at the gate corners, wherein said ions are selected from the group consisting of non-oxidation retarding ions, Si ions and mixtures thereof,
   (b) exposing the Si-containing transistor including implanted transistor gate corners to an oxidizing ambient; and
   (c) forming diffusion regions in said substrate.

2. The method of claim 1 wherein said non-retarding oxidation ions are selected from the group consisting of O, Ge, As, B, P, In, Sb, Ga, F, Cl, He, Ar, Kr, Xe and mixtures thereof.

3. The method of claim 1 wherein step (a) is carried out using an angle implant process.

4. The method of claim 1 wherein said Si-containing transistor is a MOS or FET transistor.

5. The method of claim 1 wherein said diffusion regions are formed by ion implantation and annealing.

6. The method of claim 1 wherein said Si-containing transistor includes a Si-containing substrate, a gate dielectric, a gate conductor and an optional dielectric cap.

7. The method of claim 1 wherein step (a) is performed using an ion dose of from about 1E13 to about 1E17 $cm^{-2}$.

8. The method of claim 1 wherein step (a) is carried out at an energy of from about 1 eV to about 1 MeV.

9. The method of claim 1 wherein step (b) is performed at a temperature of from about 600° to about 1200° C. for a time period of from about 0.1 seconds to about 2 hours.

10. The method of claim 1 wherein said oxidizing ambient comprises an oxygen-containing atmosphere.

11. The method of claim 1 wherein said oxidizing ambient is diluted with $H_2$.

12. The method of claim 6 wherein said Si-containing substrate comprises a Si-containing semiconducting material selected from the group consisting of Si, SiGe, SiGeC, SiC, Si/Si, Si/SiGe and silicon-on-insulators.

13. The method of claim 6 wherein said gate dielectric is an oxide, a nitride, an oxynitride or mixtures and multilayers thereof.

14. The method of claim 6 wherein said gate conductor is a conductive material selected from the group consisting of elemental metals, suicides or nitrides of elemental metals, polysilicon, amorphous silicon and combinations or multilayers thereof.

15. The method of claim 6 wherein said optional dielectric cap is an oxide, a nitride, an oxynitride or combinations and multilayers thereof.

16. The method of claim 14 wherein said gate conductor is a multilayer of doped polysilicon, Ti barrier and tungsten.

17. The method of claim 7 wherein said ion dose is from about 1E14 to about 1E16 $cm^{-2}$.

18. The method of claim 11 wherein said energy is from about 100 eV to about 100 keV.

19. The method of claim 9 wherein said temperature is from about 800° to about 1100° C. for a time period of from about 1 second to about 1 hour.

20. The method of claim 10 wherein said oxygen-containing atmosphere comprises $O_2$, steam, $N_2O$, NO, oxygen free radicals or mixtures thereof.

21. The method of claim 11 wherein said diluted oxidizing ambient includes from about 0.1 to about 40% of an oxygen-containing ambient and from about 60 to about 99.9% of $H_2$.

22. A method for oxidizing transistor gate corners comprising the steps of:
(a) implanting ions into gate corners of a Si-containing transistor, wherein said ions are selected from the group consisting of Si, O, Ge, As, B, P, In, Sb, Ga, F, Cl and mixtures thereof; and
(b) exposing the Si-containing transistor including implanted transistor gate corners to an oxidizing ambient.

* * * * *

UNITED STATES PATENT AND TRADEMARK OFFICE
CERTIFICATE OF CORRECTION

PATENT NO. : 6,514,843 B2
DATED : February 4, 2003
INVENTOR(S) : O. Dakumaci et al.

It is certified that error appears in the above-identified patent and that said Letters Patent is hereby corrected as shown below:

Column 1,
Line 15, "Modem" should read -- Modern --

Column 3,
Line 57, "suicides" should read -- silicides --

Column 6,
Line 44, "or" should read -- for --
Line 50, "thereof," should read -- thereof; --

Column 7,
Line 21, "suicides" should read -- silicides --

Column 8,
Line 5, "Claim 11" should read -- Claim 8 --

Signed and Sealed this

Twenty-fourth Day of June, 2003

JAMES E. ROGAN
*Director of the United States Patent and Trademark Office*